(12) United States Patent
Wang et al.

(10) Patent No.: US 10,304,820 B1
(45) Date of Patent: May 28, 2019

(54) ELECTROSTATIC DISCHARGE PROTECTION APPARATUS AND APPLICATIONS THEREOF

(71) Applicant: MACRONIX INTERNATIONAL CO., LTD., Hsinchu (TW)

(72) Inventors: Shih-Yu Wang, Taipei (TW); Wen-Tsung Huang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/941,235

(22) Filed: Mar. 30, 2018

(51) Int. Cl.
*H01L 27/02* (2006.01)
*H02H 9/04* (2006.01)

(52) U.S. Cl.
CPC ...... *H01L 27/0262* (2013.01); *H01L 27/0255* (2013.01); *H02H 9/046* (2013.01)

(58) Field of Classification Search
CPC .. H01L 27/0262; H01L 27/0255; H02H 9/046
See application file for complete search history.

(56) References Cited

U.S. PATENT DOCUMENTS

| | | | | |
|---|---|---|---|---|
| 5,949,094 A * | 9/1999 | Amerasekera | ...... | H01L 27/0262 257/173 |
| 6,072,677 A * | 6/2000 | Chen | ...... | H01L 27/0251 361/111 |
| 6,281,527 B1 * | 8/2001 | Chen | ...... | H01L 27/0262 257/168 |
| 6,410,963 B1 * | 6/2002 | Lai | ...... | H01L 27/0251 257/355 |
| 6,476,422 B1 * | 11/2002 | Yu | ...... | H01L 27/0262 257/173 |
| 6,759,691 B2 * | 7/2004 | Chen | ...... | H01L 27/0262 257/107 |
| 6,849,902 B1 * | 2/2005 | Lin | ...... | H01L 27/0266 257/355 |

(Continued)

OTHER PUBLICATIONS

Non-Final Office Action issued in U.S. Appl. No. 15/086,119, filed Mar. 31, 2016, dated Mar. 13, 2018.

(Continued)

*Primary Examiner* — Earl N Taylor
(74) *Attorney, Agent, or Firm* — McClure, Qualey & Rodack, LLP

(57) ABSTRACT

An ESD protection apparatus includes first and second parasitic bipolar junction transistors having different majority carriers formed in a substrate and an ESD protection device having a grounding end and a connecting end connected to the first parasitic bipolar junction transistor. When an ESD voltage applied to the ESD protection apparatus is greater than a ground voltage, a first current is grounded by passing through one of a first assembled protecting circuit including the first parasitic bipolar junction transistor and the ESD protection device and a second assembled protecting circuit including the first and the second parasitic bipolar junction transistor; and when an ESD voltage applied to the ESD protection apparatus is less than a ground voltage, a second current coming from a ground is directed to a voltage source by passing through the other one of the first assembled protecting circuit and the second assembled protecting circuit.

10 Claims, 4 Drawing Sheets

(56) References Cited

U.S. PATENT DOCUMENTS

| | | | | |
|---|---|---|---|---|
| 7,064,358 B2* | 6/2006 | Manna | | H01L 27/0259 |
| | | | | 257/173 |
| 9,633,992 B1* | 4/2017 | Huang | | H01L 27/0262 |
| 9,704,851 B2 | 7/2017 | De Raad et al. | | |
| 2001/0007521 A1* | 7/2001 | Chen | | H01L 27/0255 |
| | | | | 361/56 |
| 2002/0079541 A1* | 6/2002 | Parat | | H01L 27/0251 |
| | | | | 257/355 |
| 2004/0207020 A1* | 10/2004 | Chen | | H01L 27/0262 |
| | | | | 257/355 |
| 2004/0217425 A1* | 11/2004 | Brodsky | | H01L 27/0248 |
| | | | | 257/360 |
| 2005/0133868 A1* | 6/2005 | Su | | H01L 27/0262 |
| | | | | 257/355 |
| 2008/0253046 A1* | 10/2008 | Lou | | H01L 27/0262 |
| | | | | 361/56 |
| 2010/0271738 A1 | 10/2010 | Tsai | | |
| 2011/0147909 A1* | 6/2011 | Hsuan | | H01L 25/0657 |
| | | | | 257/686 |
| 2012/0049241 A1 | 3/2012 | Vashchenko | | |
| 2012/0049326 A1 | 3/2012 | Vashchenko | | |
| 2013/0026550 A1* | 1/2013 | Yoshioka | | H01L 29/861 |
| | | | | 257/296 |
| 2013/0300487 A1 | 11/2013 | Barrow et al. | | |
| 2014/0286085 A1* | 9/2014 | Miyakawa | | G11C 11/1695 |
| | | | | 365/158 |
| 2014/0291765 A1* | 10/2014 | Ouyang | | H01L 27/0277 |
| | | | | 257/355 |
| 2016/0358904 A1* | 12/2016 | Lin | | H01L 27/0274 |
| 2017/0126184 A1 | 5/2017 | Oh et al. | | |
| 2017/0170167 A1* | 6/2017 | Jang | | H01L 27/0262 |
| 2017/0287895 A1* | 10/2017 | Wang | | H01L 27/0262 |
| 2018/0090482 A1* | 3/2018 | Lee | | H01L 27/0277 |
| 2018/0096986 A1* | 4/2018 | Oh | | H01L 27/0266 |
| 2018/0211950 A1* | 7/2018 | Chiu | | H01L 27/0266 |
| 2018/0226788 A1* | 8/2018 | Salcedo | | H01L 23/5286 |

OTHER PUBLICATIONS

TIPO Office Action dated Oct. 19, 2018 in Taiwan application (No. 107111332).

* cited by examiner

ELECTROSTATIC DISCHARGE PROTECTION APPARATUS AND APPLICATIONS THEREOF

BACKGROUND

Technical Field

The disclosure in generally relates to a semiconductor integrated circuit (IC) and the applications thereof, and more particularly to an electrostatic discharge (ESD) protection apparatus and the applications thereof.

Description of the Related Art

ESD is the transmission of accumulated electrostatic charge between two different objects with unequal electrical potentials. High-density current with extremely high electrical potential may transmitted within a very short time interval. And, a semiconductor device may be burnt down when the ESD current passing there through. It is necessary to provide an ESD protection apparatus and a discharge circuit preventing the semiconductor device from being damaged by ESD current resulted from a human body or a machine.

To take an ESD protection apparatus applied in an integration circuit as an example, a plurality of metal-oxide-semiconductor (MOS) transistors that may configure a parasitic bipolar junction transistor (BJT) circuit in the integration circuit are applied between an input/output (I/O) pad and an internal circuit to protect the internal circuit from being damaged by ESD current directed into the integration circuit from the I/O pad. In order to increase the trigger voltage (Vt) and the holding voltage (Vh) of the ESD protection apparatus, as well as to improve the current shunting thereof, a plurality of diodes connected in series are provided between the I/O pad and the ESD protection apparatus.

However, an inversed ESD current triggered by an ESD impact with opposite charge may be stocked by these diodes, and the ESD protection apparatus and the internal circuit may be burnt down. Another ESD protection apparatus used to shunt the inversed ESD current is required. But, by this approach, the lay-out size of the semiconductor IC can be increased which does not caught up with the design trends toward scaling down the size of the semiconductor device.

Therefore, there is a need of providing an improved ESD protection apparatus and the applications thereof to obviate the drawbacks encountered from the prior art.

SUMMARY

One aspect of the present disclosure is to provide an ESD protection apparatus, wherein the ESD protection apparatus includes a semiconductor substrate, a first doping well, a second doping well, a first doping area, a second doping area, a third doping area, a fourth doping area and an ESD protection device. The first doping well is disposed in the semiconductor substrate. The second doping well is disposed in the first doping well. The first doping area and the second doping area are both disposed in the second doping well, separated with each other and connected to a voltage source. The third doping area is disposed in the first doping well. The fourth doping area is disposed in the semiconductor substrate, adjacent to the first doping well and grounded. Wherein the first doping area, the second doping well and the first doping well are integrated to form a first parasitic bipolar junction transistor (BJT); the second doping area, the first doping well and the fourth doping area are integrated to form a second parasitic BJT; and the first parasitic BJT and the second parasitic BJT have different majority carriers. The ESD protection device includes a grounding end and a connecting end connected to the third doping area. When a voltage provided by the voltage source is greater than a ground voltage, a first current is grounded by passing through one of a first assembled protecting circuit including a parasitic diode of the first parasitic BJT and the ESD protection device and a second assembled protecting circuit including the first parasitic BJT and the second parasitic BJT; and when a voltage provided by the voltage source is less than a ground voltage, a second current coming from the ground is directed to the voltage source by passing through the other one of the first assembled protecting circuit and the second assembled protecting circuit.

Another aspect of the present disclosure is to provide a memory device, wherein the memory device includes an ESD protection apparatus aforementioned and a memory cell array electrically connected to the ESD protection apparatus.

Yet another aspect of the present disclosure is to provide an ESD protecting method to protect an internal circuit, wherein the method including steps as follows: An ESD protection apparatus as mentioned above is firstly provided to electrically connect the internal circuit. When an ESD stress having a voltage greater than a ground voltage is applied to the internal circuit, a first ESD current is directed into the ground through one of a first assembled protecting circuit including a parasitic diode of the first parasitic BJT and the ESD protection device, and a second assembled protecting circuit including the first parasitic BJT and the second parasitic BJT; and when an ESD stress having a voltage less than the ground voltage is applied to the internal circuit, a second ESD current coming from the ground is directed into the voltage source applying the ESD stress through the other one of the first assembled protecting circuit and the second assembled protecting circuit.

In accordance with the aforementioned embodiments of the present disclosure, an ESD protection apparatus and applications thereof are provided. A plurality of parasitic BJTs are formed in a semiconductor substrate by an ion implantation process to form a reverse-triggering silicon controlled rectifier (SCR), and an ESD protection apparatus is formed by integrating the reverse-triggering SCR with a forward ESD protection device and an internal circuit. When an ESD stress is applied to the internal circuit, a forward ESD current is directed into the ground through the ESD protection device, and a reverse ESD current coming from the ground is directed into the voltage source applying the ESD stress through the reverse-triggering SCR.

In this embodiment the reverse-triggering SCR is a parasitic circuit including an NPN BJT and a PNP BJT formed in a doping well having a plurality of N type dopants, wherein the grounded terminal of the reverse-triggering SCR is a P type doping area, and the terminal of the reverse-triggering SCR that is connected to the internal circuit being protected is an N type doping area. Because a prior art reverse-triggering ESD protection device, generally may be a parasitic PN BJT having a P terminal connecting to the ground and an N terminal connecting to the internal circuit, may trigger a large amount of current leakage, at the time when the reverse ESD stress applied to the internal circuit to make the operation voltage of the internal circuit less than that of the ground. The prior art problems of current leakage due to the reverse ESD stress can be thus resolved by using the reverse-triggering SCR provided by the embodiments of the present disclosure to take the place of the prior art parasitic PN BJT.

In some embodiments of the present disclosure, a forward-triggering SCR and a reverse ESD protection device are integrated to serve as an ESD for protecting an internal circuit. When an ESD stress is applied to the internal circuit, a reverse ESD current is directed into the ground through the reverse ESD protection device, and a forward ESD current is directed into the ground through the forward-triggering SCR. Both forward and reverse ESD current applied to the internal circuit can be effectively shunted by the ESD protection apparatus without further providing another ESD protection device which requires more wiring space. Such that the lay-out size of the semiconductor IC applying the present ESD protection apparatus can be decreased. In this embodiment the forward-triggering SCR is a parasitic circuit including an NPN BJT and a PNP BJT formed in a doping well having a plurality of P type dopants, wherein the grounded terminal of the reverse-triggering SCR is an N type doping area, and the terminal of the reverse-triggering SCR that is connected to the circuit being protected is a P type doping area.

The above objects and advantages of the present disclosure will become more readily apparent to those ordinarily skilled in the art after reviewing the following detailed description and accompanying drawings, in which:

DETAILED DESCRIPTION

Figure 1:
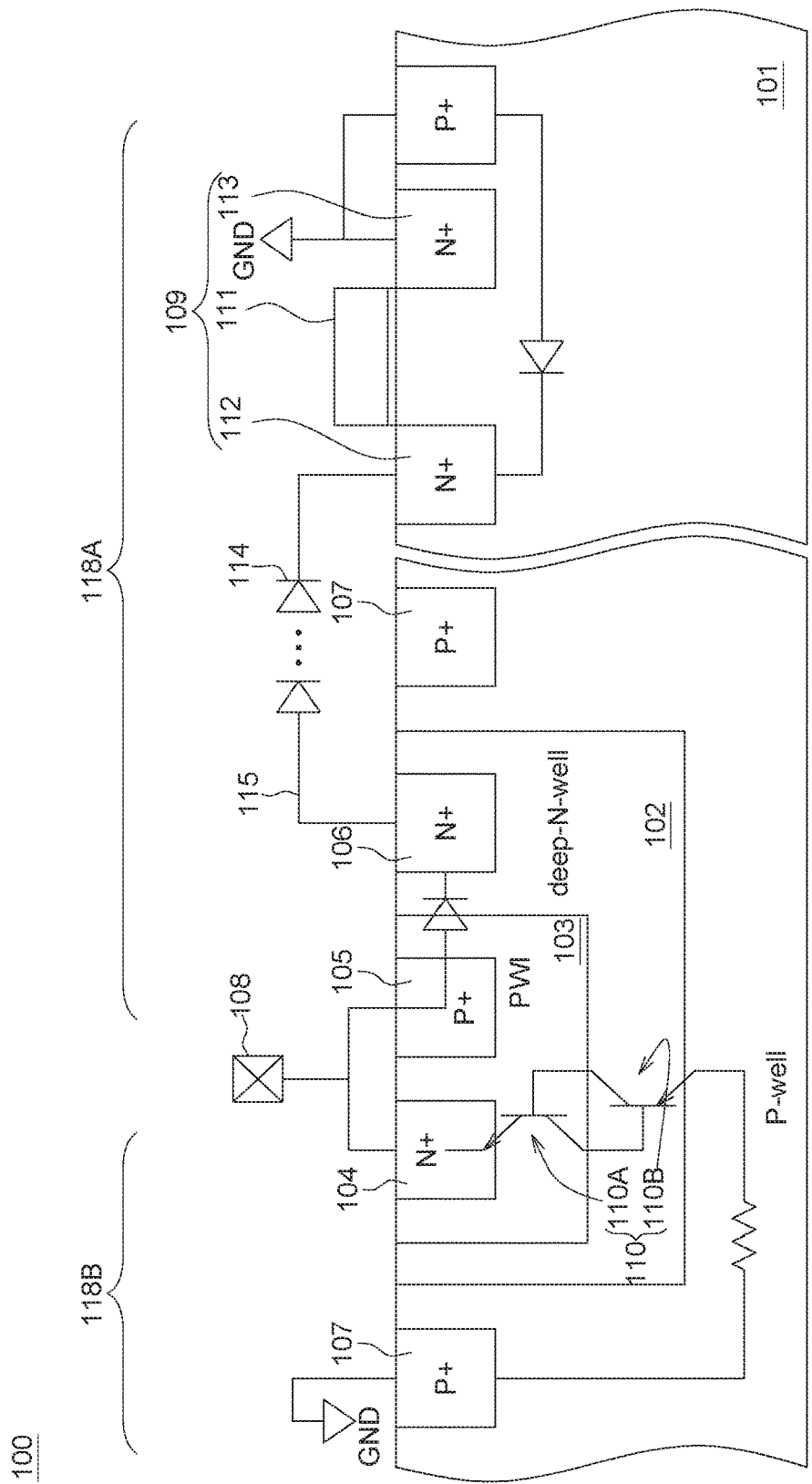
FIG. 1 is a cross-sectional view illustrating an ESD protection apparatus and the equivalent-circuit diagram thereof in accordance with one embodiment of the present disclosure.

The embodiments as illustrated below provide an ESD protection apparatus and applications thereof to both shunt forward and reverse ESD current applied to the internal circuit protected by the ESD protection apparatus. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention.

In addition, the illustrations may not be necessarily be drawn to scale, and the identical elements of the embodiments are designated with the same reference numerals.

FIG. 1 is a cross-sectional view illustrating an ESD protection apparatus 100 and the equivalent-circuit diagram thereof in accordance with one embodiment of the present disclosure. In the present embodiment, the ESD protection apparatus 100 includes a semiconductor substrate 101, a first doping well 102, a second doping well 103, a first doping area 104, a second doping area 105, a third doping area 106, a fourth doping area 107, a pad 108 and an ESD protection device 109.

The first doping well 102 is disposed in the semiconductor substrate 101. The second doping well 103 is disposed in the first doping well 102. The first doping area 104 and the second doping area 105 both are disposed in the second doping well 103, separated with each other and connected to a voltage source through the pad 108. The third doping area 106 is disposed in the first doping well 102. The fourth doping area 107 is disposed in the semiconductor substrate 101, adjacent to the first doping well 102 and grounded. In the present embodiment, the fourth doping area 107 can (but not limited to) surround the first doping well 102.

In some embodiments of the present disclosure, the semiconductor substrate 101 can be made of semiconductor materials (such as silicon (Si), germanium (Ge), and so on), compound semiconductor materials (such as silicon carbide (SiC), gallium arsenide (GaAs), iodine phosphide (IP), phosphide (GaP), iodine arsenide (IAs) and/or iodine antimony (ISb)). In the present embodiment, the semiconductor substrate 101 can be a silicon wafer.

In the present embodiment, the semiconductor substrate 101 may include a p type doping well (referred to as P-Well) in which a plurality of p type dopants, such as aluminum ion (Al), boron ion (B), gallium (Ga) or the arbitrary combinations thereof, implanted therein. The first doping well 102 is an N type deep doping well (referred to as deep-N-Well) having a plurality of P type dopants, such as ion arsonium ion (As), phosphorusion (P) or the combination thereof, implanted therein; and the second doping well 103 is a P type doping well (referred to as PWI) doped with p type dopants. The first doping area 104 and the third doping area 106 are N type doping areas (referred to as N+) having a doping concentration substantially greater than the second doping well 103. The second doping area 105 and the fourth doping area 107 are P type doping areas (also referred to as P+) having a doping concentration substantially greater than the first doping well 102.

The first doping area 104, the second doping well 103 and the first doping well 102 are integrated to form an NPN parasitic BJT 110A having n-type majority carriers; and the fourth doping area 107, the first doping well 102, the second doping area 105 are integrated to form a PNP parasitic BJT 110B having p-type majority carriers. The collector of the PNP parasitic BJT 110B is connected to the base of the NPN parasitic BJT 110A; and the base of the PNP parasitic BJT 110B is connected to the collector of the NPN parasitic BJT 110A, whereby a parasitic SCR 110 is formed in the semiconductor substrate 101. Wherein the first doping area 104 may serve as the cathode of the parasitic SCR 110 and the fourth doping area 107 may serve as the anode of the parasitic SCR 110.

In some embodiments of the preset disclosure, the ESD protection device 109 may include at least one of a MOS transistor and a SCR. The ESD protection device 109 may also include any device and circuit providing an ESD function. For example, the ESD protection device 109 includes a gate structure 111, a fifth doping area 112 and a sixth doping area 113, wherein the gate structure 111 is disposed on the semiconductor substrate 101; the fifth doping area 112 and the sixth doping area 113 are formed in the semiconductor substrate 101 adjacent to the gate structure 111. In the present embodiment, the fifth doping area 112 and the sixth doping area 113 can be two N type heavy doping areas (also referred to as N+) formed in the P well of the semiconductor substrate 101; and the gate structure 111, the fifth doping area 112 and the sixth doping area 113 are integrated to form an NMOS in the semiconductor substrate 101, wherein the fifth doping area 112 and the sixth doping area 113 can be respectively serve as the drain and source of an NMOS transistor. The fifth doping area 112 is electrically connected to the third doping area 106 through a wire 115. When the voltage provided by the voltage source is greater than a ground voltage, the current resulted from the voltage source can pass though the pad 108, the second doping area 105, the second doping well 103, the first doping well 102 and the third doping area 106 transmitting through a wire 115 to the ESD protection device 109 and then be directed into the ground GND.

In order to increase the trigger voltage (Vt) and the holding voltage (Vh) of the ESD protection device 109, the ESD protection apparatus 100 may further includes a plurality of diode devices 114 or resist devices (not shown) electrically connected in series between the third doping area 106 and the ESD protection device 109.

Figure 2:
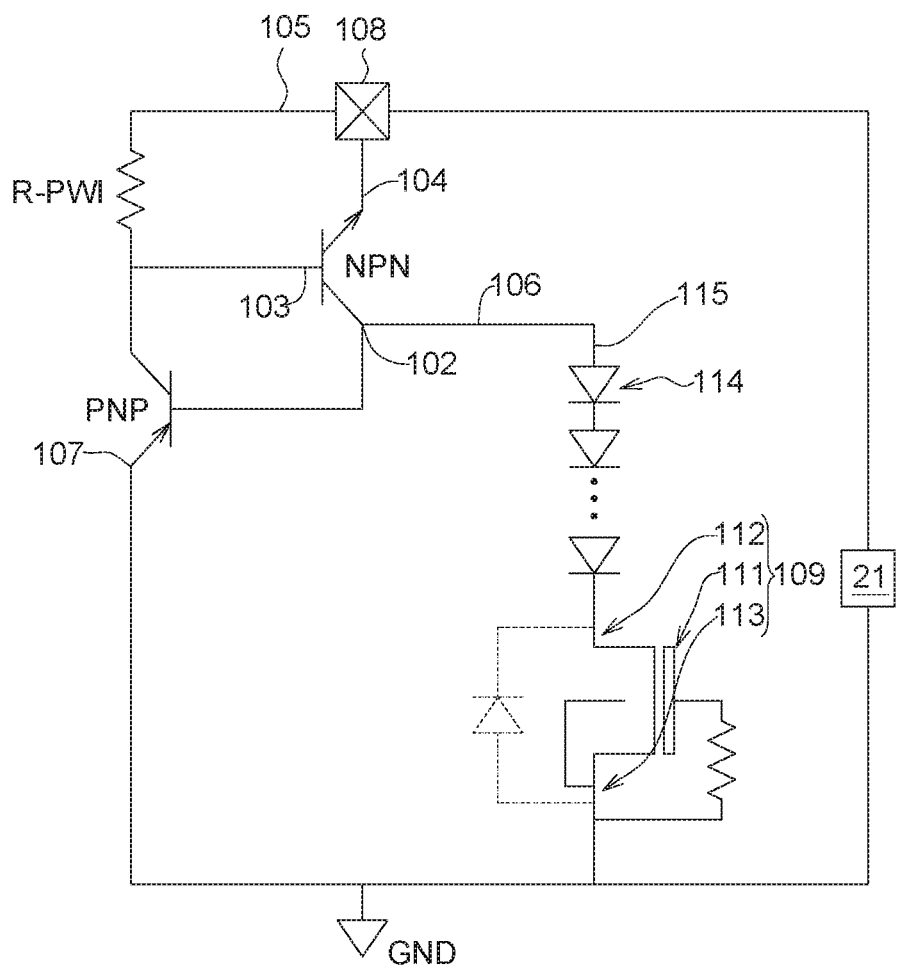
FIG. 2 is a circuit diagram illustrating the layout of a semiconductor IC applying the ESD protection apparatus depicted in FIG. 1.

In some embodiments of the present disclosure, the ESD protection apparatus 100 can be used to protect an internal circuit 21 involved in a semiconductor IC 20 from being damaged by ESD current. FIG. 2 is a circuit diagram illustrating the layout of a semiconductor IC 20 applying the ESD protection apparatus 100 depicted in FIG. 1. In the present embodiment, the semiconductor IC 20 can be a memory device, and the internal circuit 21 can be a memory cell array, wherein the internal circuit 21 is electrically connected to the parasitic SCR 110 of the ESD protection apparatus 100. The internal circuit 21 may not be limited to a memory cell array. In some other embodiments of the present disclosure, the internal circuit 21 can be any semiconductor device, IC or the combination thereof.

When the internal circuit 21 protected by the ESD protection apparatus 100 is subjected to a positive ESD stress (with a voltage greater than a ground voltage) provided by the voltage source, and the positive ESD potential is greater than the Vt of the ESD protection device 109, the ESD protection device 109 can be turn on to direct the positive ESD current resulted from the voltage source into the ground GND by passing through a first assembled protecting circuit 118A including the pad 108, a parasitic diode (formed between the first doping well 102 and the second doping well 103) of the NPN parasitic BJT 110A and the ESD protection device 109 (i.e. passing though the pad 108, the second doping area 105, the second doping well 103, the first doping well 102 and the third doping area 106 transmitting through a wire 115 to the ESD protection device 109), and then be directed into the ground GND. When the internal circuit 21 protected by the ESD protection apparatus 100 is subjected to an inverse ESD stress (with a voltage less than the ground voltage) provided by the voltage source, and the inverse ESD potential is greater than the Vt of the parasitic SCR 110, the parasitic SCR 110 can be turn on to direct inverse ESD current resulted from the voltage source (i.e. coming from the ground GNG) into the pad 108 by passing through a second assembled protecting circuit 118B including the PNP parasitic BJT 110B and the NPN parasitic BJT 110A.

Figure 3:
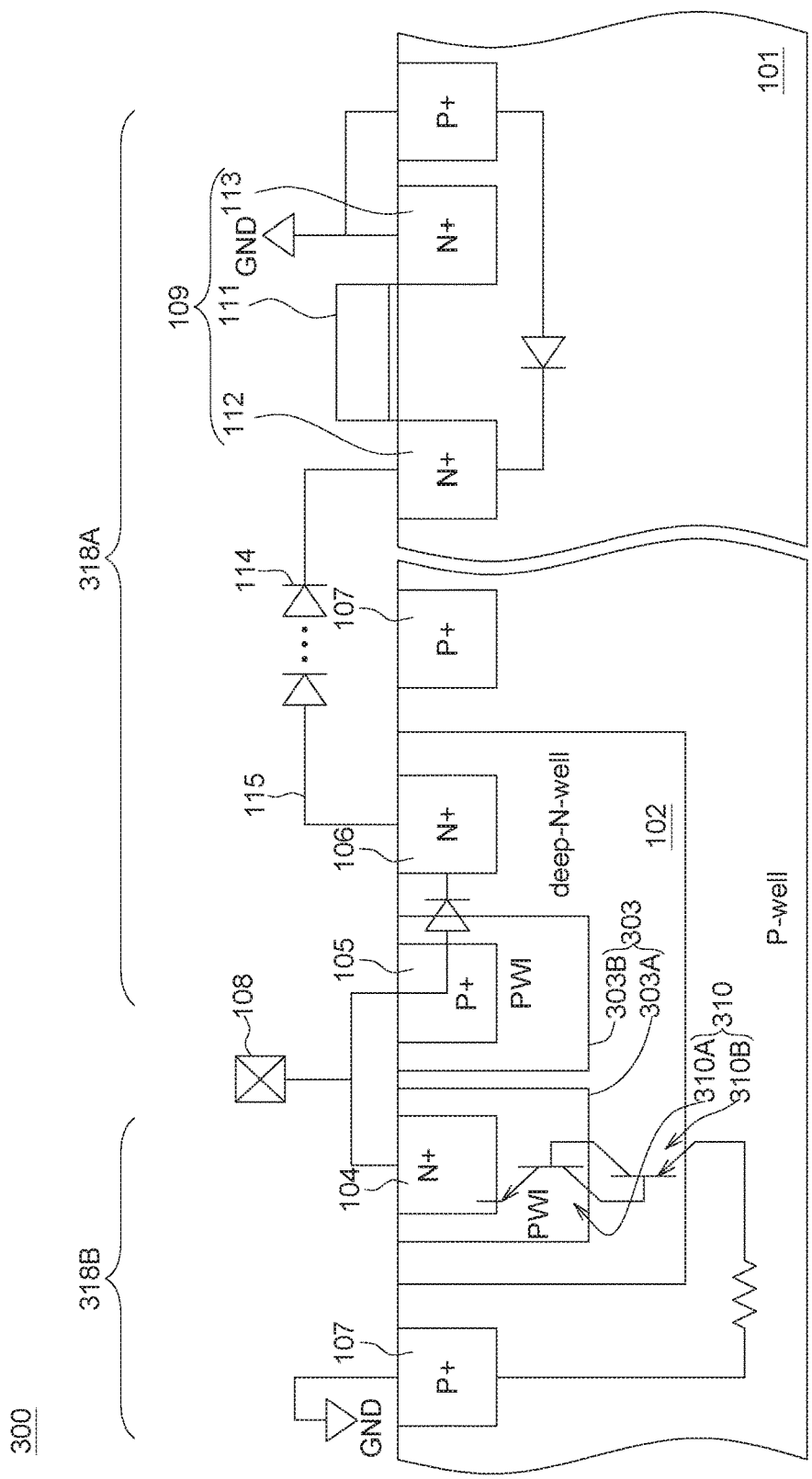
FIG. 3 is a cross-sectional view illustrating an ESD protection apparatus and the equivalent-circuit diagram thereof in accordance with another embodiment of the present disclosure.

FIG. 3 is a cross-sectional view illustrating an ESD protection apparatus 300 and the equivalent-circuit diagram thereof in accordance with another embodiment of the present invention. The structure of the ESD protection apparatus 300 is similar to that of the ESD protection apparatus 100 depicted in FIG. 1, except that the second doping well 303 of the ESD protection apparatus 300 is divided into a first portion 303A and a second portion 303B separated from the first portion 303A, wherein the first doping area 104 and the second doping area 105 are respectively disposed in the first portion 303A and the second portion 303B.

In the present embodiment, the first doping well 102, the first portion 303A of the second doping well 303 and the first doping area 104 are integrated to form an NPN parasitic BJT 310A having n-type majority carriers; and the first doping well 102, the first portion 303A of the second doping well 303 and the fourth doping area 107 are integrated to form a PNP parasitic BJT 310B having p-type majority carriers. The collector of the PNP parasitic BJT 310B is connected to the base of the NPN parasitic BJT 310A; and the base of the PNP parasitic BJT 310B is connected to the collector of the NPN parasitic BJT 310A, whereby a parasitic SCR 310 is formed in the semiconductor substrate 101. The first doping area 104 may serve as the cathode of the parasitic SCR 310 and the fourth doping area 107 may serve as the anode of the parasitic SCR 310.

When the pad 108 is subjected to a positive ESD stress (with a voltage greater than a ground voltage) provided by the voltage source, and the positive ESD potential is greater than the Vt of the ESD protection device 109, the ESD protection device 109 can be turn on to direct positive ESD current resulted from the voltage source into the ground GND by passing through a first assembled protecting circuit 318A including the pad 108, a parasitic diode (formed between the first doping well 102 and the second portion 303B) of the NPN parasitic BJT 310A and the ESD protection device 109 (i.e. passing though the pad 108, the second doping area 105, the second portion 303B of the second doping well 303, the first doping well 102 and the third doping area 106 transmitting through a wire 115 to the ESD protection device 109), and then be directed into the ground GND. When the pad 108 is subjected to an inverse ESD stress (with a voltage less than the ground voltage) provided by the voltage source, and the inverse ESD potential is greater than the Vt of the parasitic SCR 110, the parasitic SCR 110 can be turn on to direct inverse ESD current resulted from the voltage source (i.e. coming from the ground GNG) into the pad 108 by passing through a second assembled protecting circuit 318B including the PNP parasitic BJT 110B and the NPN parasitic BJT 110A. In some embodiments, when the first portion 303A of the second doping well 303 is floating from earth ground, the trigger voltage of the parasitic SCR 310 can be decreased significantly.

Figure 4:
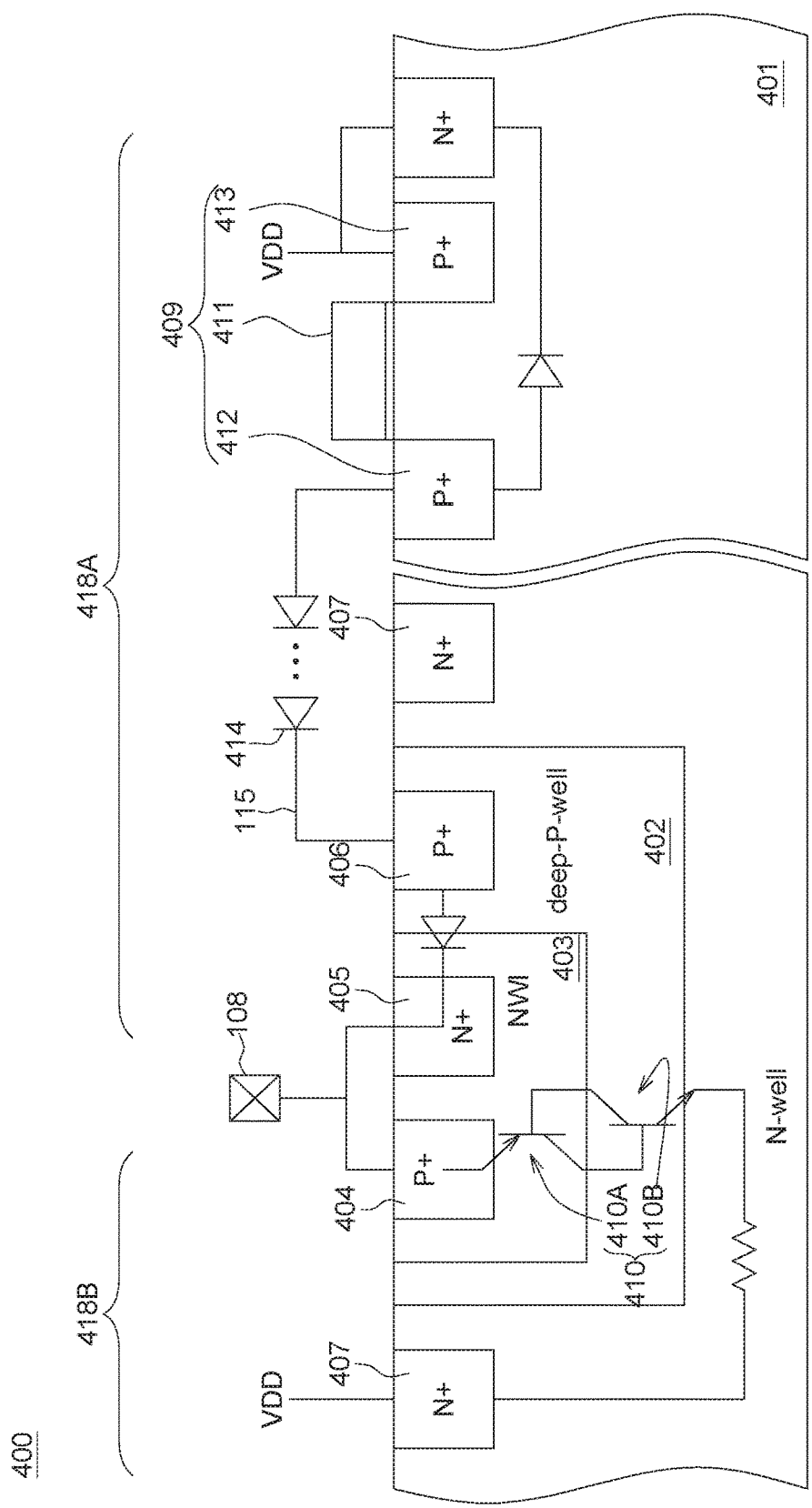
FIG. 4 is a cross-sectional view illustrating an ESD protection apparatus and the equivalent-circuit diagram thereof in accordance with yet another embodiment of the present invention.

FIG. 4 is a cross-sectional view illustrating an ESD protection apparatus 400 and the equivalent-circuit diagram thereof in accordance with another embodiment of the present invention. The structure of the ESD protection apparatus 400 is similar to that of the ESD protection apparatus 100 depicted in FIG. 1, except that the diode devices 414 have reverse conductivities against that of the ESD protection apparatus 100.

In the present embodiment, the first doping area 404, the second doping well 403 and the first doping well 402 are integrated to form an PNP parasitic BJT 410A having p-type majority carriers; and the fourth doping area 407, the first doping well 402, the second doping area 405 are integrated to form a NPN parasitic BJT 410B having n-type majority carriers. The collector of the NPN parasitic BJT 410B is connected to the base of the PNP parasitic BJT 410A; and the base of the NPN parasitic BJT 410B is connected to the collector of the PNP parasitic BJT 410A, whereby a parasitic SCR 410 is formed in the semiconductor substrate 401. Wherein the first doping area 404 may serve as the anode of the parasitic SCR 410 and the fourth doping area 407 may serve as the cathode of the parasitic SCR 410.

The ESD protection device 409 includes a gate structure 411 disposed on a semiconductor substrate 401, a fifth doping area 412 and a sixth doping area 413 formed in the semiconductor substrate 401. In the present embodiment, the fifth doping area 412 and the sixth doping area 413 can be two P type heavy doping areas (also referred to as P+) formed in the N well of the semiconductor substrate 401 and disposed adjacent to the gate structure 411; the gate structure 411, the fifth doping area 412 and the sixth doping area 413 can be integrated to form an PMOS in the semiconductor substrate 401, wherein the fifth doping area 412 and the sixth doping area 413 can be respectively serve as the drain and source of an PMOS transistor. The fifth doping area 412 is electrically connected to the third doping area 406 through a wire 115. The ESD protection apparatus 400 may further includes a plurality of diode devices 414 electrically connected in series between the third doping area 406 and the ESD protection device 409.

When the pad 108 is subjected to a reverse ESD stress (with a voltage less than a ground voltage) provided by the voltage source, and the reverse ESD potential is greater than the Vt of the ESD protection device 409, the ESD protection device 409 can be turn on to direct the reverse ESD current resulted from the voltage source into the ground GND by passing through a first assembled protecting circuit 418A including the pad 108, a parasitic diode (formed between the first doping well 402 and the second doping well 403) of the PNP parasitic BJT 410A and the ESD protection device 409 (i.e. passing though the pad 108, the second doping area 405, the second doping well 403, the first doping well 402 and the third doping area 406 transmitting through a wire 115 to the ESD protection device 409), and then be directed into the voltage source VDD resulting the reverse ESD stress. When the pad 108 is subjected to a positive ESD stress (with a voltage greater than the ground voltage) provided by the voltage source, and the positive ESD potential is greater than the Vt of the parasitic SCR 410, the parasitic SCR 410 can be turn on to direct the positive ESD current resulted from the voltage source VDD into the pad 108 by passing through a second assembled protecting circuit 418B including the NPN parasitic BJT 410B and the PNP parasitic BJT 410A.

In accordance with the aforementioned embodiments of the present disclosure, an ESD protection apparatus and applications thereof are provided. A plurality of parasitic BJTs are formed in a semiconductor substrate by an ion implantation process to form a reverse-triggering SCR, and an ESD protection apparatus is formed by integrating the reverse-triggering SCR with a forward ESD protection device and an internal circuit. When an ESD stress is applied to the internal circuit, a forward ESD current is directed into the ground through the ESD protection device, and a reverse ESD current is directed into the ground through the reverse-triggering SCR.

In this embodiment the reverse-triggering SCR is a parasitic circuit including an NPN BJT and a PNP BJT formed in a doping well having a plurality of N type dopants, wherein the grounded terminal of the reverse-triggering SCR is a P type doping area, and the terminal of the reverse-triggering SCR that is connected to the internal circuit being protected is an N type doping area. Because a prior art reverse-triggering ESD protection device, generally may be a parasitic PNP BJT having a P terminal connecting to the ground and an N terminal connecting to the internal circuit, may trigger a large amount of current leakage, at the time when the reverse ESD stress applied to the internal circuit to make the operation voltage of the internal circuit less than that of the ground. The prior art problems of current leakage due to the reverse ESD stress can be thus resolved by using the reverse-triggering SCR provided by the embodiments of the present disclosure to take the place of the prior art parasitic PNP BJT.

In some embodiments of the present disclosure, a forward-triggering SCR and a reverse ESD protection device are integrated to serve as an ESD for protecting an internal circuit. When an ESD stress is applied to the internal circuit, a reverse ESD current is directed into the ground through the reverse ESD protection device, and a forward ESD current is directed into the ground through the forward-triggering SCR. Both forward and reverse ESD current applied to the internal circuit can be effectively shunted by the ESD protection apparatus without further providing another ESD protection device which requires more wiring space. Such that the lay-out size of the semiconductor IC applying the present ESD protection apparatus can be decreased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection apparatus, comprising:
   a semiconductor substrate;
   a first doping well, disposed in the semiconductor substrate;
   a second doping well, disposed in the first doping well;
   a first doping area, disposed in the second doping well, and connected to a voltage source;
   a second doping area, disposed in the second doping well, separated with the first doping area and connected to the voltage source;
   a third doping area, disposed completely in the first doping well;
   a fourth doping area, disposed in the semiconductor substrate, adjacent to the first doping well and grounded;
   wherein the first doping area, the first doping well and the second doping well are integrated to form a first parasitic bipolar junction transistor (BJT); the second doping area, the first doping well and the fourth doping area are integrated to form a second parasitic BJT; and the first parasitic BJT and the second parasitic BJT have different majority carriers; and
   an ESD protection device, comprising a grounding end and a connecting end connected to the third doping area;

when a voltage provided by the voltage source is greater than a ground voltage, a first current is grounded by passing through one of a first assembled protecting circuit including a parasitic diode of the first parasitic BJT and the ESD protection device and a second assembled protecting circuit including the first parasitic BJT and the second parasitic BJT; and when a voltage provided by the voltage source is less than a ground voltage, a second current coming from a ground is directed to the voltage source by passing through the other one of the first assembled protecting circuit and the second assembled protecting circuit.

2. The ESD protection apparatus according to claim 1, wherein the second doping well is divided into a first portion and a second portion separated from the first portion; and the first doping area and the second doping area are respectively disposed in the first portion and the second portion.

3. The ESD protection apparatus according to claim 1, wherein the first doping well, the first doping area and the third doping area have a plurality of N type dopants; the semiconductor substrate, the second doping well, the second doping area and the fourth doping area have a plurality of P type dopants.

4. The ESD protection apparatus according to claim 3, wherein the first parasitic BJT and the second parasitic BJT are integrated to form a parasitic silicon controlled rectifier (SCR); the first doping area serves as a cathode of the parasitic SCR and the fourth doping area serves as an anode of the parasitic SCR.

5. The ESD protection apparatus according to claim 1, wherein the first doping well, the first doping area and the third doping area have a plurality of P type dopants; the semiconductor substrate, the second doping well, the second doping area and the fourth doping area have a plurality of N type dopants.

6. The ESD protection apparatus according to claim 1, further comprising a diode device electrically connected in series between the third doping area and the ESD protection device.

7. The ESD protection apparatus according to claim 1, wherein the ESD protection device comprises at least one of a metal-oxide-semiconductor (MOS) transistor and a silicon controlled rectifier (SCR).

8. The ESD protection apparatus according to claim 1, wherein the fourth doping area surrounds the first doping well.

9. A memory device, comprising:
an electrostatic discharge (ESD) protection apparatus, wherein the ESD protection apparatus comprises:
a semiconductor substrate;
a first doping well, disposed in the semiconductor substrate;
a second doping well, disposed in the first doping well;
a first doping area, disposed in the second doping well, and connected to a voltage source;
a second doping area, disposed in the second doping well, separated with the first doping area and connected to the voltage source;
a third doping area, disposed completely in the first doping well;
a fourth doping area, disposed in the semiconductor substrate, adjacent to the first doping well and grounded;
wherein the first doping area, the first doping well and the second doping well are integrated to form a first parasitic bipolar junction transistor (BJT); the second doping area, the first doping well and the fourth doping area are integrated to form a second parasitic BJT; and the first parasitic BJT and the second parasitic BJT have different majority carriers; and
an ESD protection device, comprising a grounding end and a connecting end connected to the third doping area
when a voltage provided by the voltage source is greater than a ground voltage, a first current is grounded by passing through one of a first assembled protecting circuit including a parasitic diode of the first parasitic BJT and the ESD protection device and a second assembled protecting circuit including the first parasitic BJT and the second parasitic BJT; and when a voltage provided by the voltage source is less than a ground voltage, a second current coming from a ground is directed to the voltage source by passing through the other one of the first assembled protecting circuit and the second assembled protecting circuit; and
a memory cell array electrically connected to the pad of the ESD protection apparatus.

10. An electrostatic discharge (ESD) protection method used to protect an internal circuit, comprising:
providing an ESD protection apparatus electrically connected to the internal circuit, wherein the ESD protection apparatus comprises:
a semiconductor substrate;
a first doping well, disposed in the semiconductor substrate;
a second doping well, disposed in the first doping well;
a first doping area, disposed in the second doping well, and connected to a voltage source;
a second doping area, disposed in the second doping well, separated with the first doping area and connected to the voltage source;
a third doping area, disposed completely in the first doping well;
a fourth doping area, disposed in the semiconductor substrate, adjacent to the first doping well and grounded;
wherein the first doping area, the first doping well and the second doping well are integrated to form a first parasitic bipolar junction transistor (BJT); the second doping area, the first doping well and the fourth doping area are integrated to form a second parasitic BJT; and the first parasitic BJT and the second parasitic BJT have different majority carriers; and
an ESD protection device, comprising a grounding end and a connecting end connected to the third doping area;
when the internal circuit is subjected to an ESD stress having a voltage greater than a ground voltage, a first ESD current resulted from the voltage source is directed into the grounding end by passing one of a first assembled protecting circuit including a parasitic diode of the first parasitic BJT and the ESD protection device and a second assembled protecting circuit including the first parasitic BJT and the second parasitic BJT;
when the internal circuit is subjected to an ESD stress having a voltage less than the ground voltage, a second ESD current coming from the grounding end is directed into the voltage source by passing the other of the first assembled protecting circuit and the second assembled protecting circuit.

* * * * *